(12) United States Patent
Fujimura et al.

(10) Patent No.: US 7,897,522 B2
(45) Date of Patent: Mar. 1, 2011

(54) METHOD AND SYSTEM FOR IMPROVING PARTICLE BEAM LITHOGRAPHY

(75) Inventors: Akira Fujimura, Saratoga, CA (US);
James Fong, Cupertino, CA (US);
Takashi Mitsuhashi, Fujisawa (JP);
Shohei Matsushita, Yokohama (JP)

(73) Assignee: Cadence Design Systems, Inc., San Jose, CA (US)

( * ) Notice: Subject to any disclaimer, the term of this patent is extended or adjusted under 35 U.S.C. 154(b) by 579 days.

(21) Appl. No.: 11/603,603

(22) Filed: Nov. 21, 2006

(65) Prior Publication Data

US 2008/0116399 A1  May 22, 2008

(51) Int. Cl.
*H01L 21/00* (2006.01)

(52) U.S. Cl. .......... 438/795; 257/E21.03; 257/E21.039; 430/5; 716/21

(58) Field of Classification Search ............... 250/492.2; 430/5; 438/795, 798, 800, 942, FOR. 459, 438/FOR. 473, 761, 947, 949; 257/E21.023, 257/E21.035, E21.03, E21.039; 716/19, 716/21

See application file for complete search history.

(56) References Cited

U.S. PATENT DOCUMENTS

| | | | |
|---|---|---|---|
| 5,424,173 A | | 6/1995 | Wakabayashi et al. |
| 5,459,771 A | * | 10/1995 | Richardson et al. ......... 378/119 |
| 5,986,292 A | * | 11/1999 | Mizuno et al. ............... 257/202 |
| 6,037,820 A | | 3/2000 | Ishizaka |
| 6,511,048 B1 | | 1/2003 | Sohda et al. |
| 6,560,768 B2 | | 5/2003 | Inanami et al. |
| 6,756,159 B2 | | 6/2004 | Inanami |
| 7,579,606 B2 | | 8/2009 | Yoshida et al. |
| 2001/0046631 A1 | * | 11/2001 | Fujiwara et al. ................ 430/5 |
| 2002/0162088 A1 | | 10/2002 | Inanami et al. |

(Continued)

FOREIGN PATENT DOCUMENTS

EP 0364929 4/1990

(Continued)

OTHER PUBLICATIONS

International Search Report and Written Opinion dated Mar. 13, 2008 for PCT/US2007/085135.

(Continued)

*Primary Examiner*—Matthew S Smith
*Assistant Examiner*—Quovaunda Jefferson
(74) *Attorney, Agent, or Firm*—Vista IP Law Group LLP

(57) ABSTRACT

A method for particle beam lithography, such as electron beam (EB) lithography, includes forming a plurality of cell patterns on a stencil mask and shaping one or more of the cell patterns with a polygonal-shaped contour. A first polygonal-shaped cell pattern is exposed to a particle beam so as to project the first polygonal-shaped cell pattern on a substrate. A second polygonal-shaped cell pattern, having a contour that mates with the contour of the first polygonal-shaped cell pattern, is exposed to the particle beam, such as an electron beam, so as to project the second polygonal-shaped cell pattern adjacent to the first polygonal-shaped cell pattern to thereby form a combined cell with the contour of the first polygonal-shaped cell pattern mated to the contour of the second polygonal-shaped cell pattern. The polygonal-shaped contour of the first and second cell patterns may comprise a rectilinear-shaped contour.

44 Claims, 6 Drawing Sheets

U.S. PATENT DOCUMENTS

| | | | |
|---|---|---|---|
| 2002/0175298 A1* | 11/2002 | Moniwa et al. | 250/492.22 |
| 2002/0179856 A1 | 12/2002 | Ito et al. | |
| 2005/0242303 A1 | 11/2005 | Platzgummer | |
| 2006/0033048 A1 | 2/2006 | Maruyama et al. | |
| 2007/0125967 A1 | 6/2007 | Lapanik et al. | |
| 2008/0116397 A1 | 5/2008 | Yoshida et al. | |
| 2008/0116398 A1 | 5/2008 | Hara et al. | |
| 2008/0118852 A1 | 5/2008 | Mitsuhashi | |
| 2008/0120073 A1 | 5/2008 | Hara et al. | |
| 2008/0305043 A1 | 12/2008 | Gregory et al. | |

FOREIGN PATENT DOCUMENTS

| | | |
|---|---|---|
| EP | 0364929 A2 | 4/1990 |
| EP | 0518783 | 12/1992 |
| EP | 0518783 A1 | 12/1992 |
| JP | 2001274077 A | 10/2001 |
| JP | 20011274077 | 10/2001 |
| JP | 2006165146 | 6/2006 |
| JP | 2006165146 A | 6/2006 |

OTHER PUBLICATIONS

Office Action dated Dec. 30, 2008 for U.S. Appl. No. 11/603,441.
Lapanik et al. U.S. Appl. No. 11/607,753, filed Nov. 11, 2006.
Mitsuhashi,T. U.S. Appl. No. 11/678,530, filed Feb. 2, 2007.
Yoshida, K., U.S. Appl. No. 11/603,441, filed Nov. 21, 2006.
Yoshida et al. U.S. Appl. No. 11/607,305, filed Dec. 1, 2006.
Fujimura et al. U.S. Appl. No. 11/677,973, filed Feb. 2, 2007.
Hara et al. U.S. Appl. No. 11/603,526, filed Nov. 11, 2006.
Mitsuhashi,T. U.S. Appl. No. 11/226,253, filed Sep. 15, 2005.
International Search Report and Written Opinion dated Sep. 19, 2008 for PCT/US2007/85097.
Extended European Search Report, dated Dec. 4, 2009 for PCT/US2007/085097.
Lapanik, D., U.S. Appl. No. 11/226,253, filed Sep. 15, 2006.
Kaiama, T. et al., "Shot reduction technique for character projection lithography using combined cell stencil", Proceedings SPIE vol. 5992 (2005), pp. 59922V-1-59922V-8, SPIE, Box 10, Bellingham, WA 98227. (Paper attached: file name shot.pdf).
Hadori, K. et al., "Electron Beam Direct Writing System EX-8D Employing Character Projection Exposure Method", Journal of Vacuum Science Technology, vol. B11(6) (1993), pp. 2346-2351, American Vacuum Society, 125 Maiden Lane, 15th Floor, New York, NY 10038. (Paper attached: file name electron_ beam. pdf).
Hara, S. et al., "Character Projection EB Data Conversion System Combined with Throughput Analyzer", Japanese Journal of Applied Physics, vol. 33 (1994), pp. 6935-6939, Japan Society of Applied Physics, Kudan-Kita building 5th floor, Kudan-Kita 1-12-3, Chiyoda-ku, Tokyo 102-0073, Japan. (Paper attached: file name character_projection. pdf).
Nakasugi, T. et al. "Maskless Lithography Using Low Energy Electron Beam: Recent Results of Proof-of-Concept Tool", Journal of Vacuum Science Technology, vol. B20(6) (2002), pp. 2651-2656, American Vacuum Society, 125 Maiden Lane, 15th Floor, New York, NY 10038. (Paper attached: file name maskless.pdf).
Fujino, T. et al., "Character-Build Standard-Cell Layout Technique for High-Throughput Character-Projection EB Lithography", Proceedings SPIE vol. 5853 (2005), pp. 161-167, SPIE, Box 10, Bellingham, WA 98227. (Paper attached: character_built.pdf).
Yamada, A. et al., "Variable cell projection as an advance in electron-beam cell projection system", Journal of Vacuum Science Technology, B 22(6) (2004), pp. 2917-2922, American Vacuum Society, 125 Maiden Lane, 15th Floor, New York, NY 10038. (Paper attached: file name JVTBD9_22_6_29176_1.pdf).
Kosai et ai, "Throughput Enhancement in Electron Beam Direct Writing by Multiple-Cell Shot Technique for Logic Devices", 17th Annual SEM1flEEE Advanced Semiconductor Manufacturing Conference, ASMC 2006, vol. 2006, pp. 253-256, Institute of Electrical and Electronics Engineers, 3 Park Ave. 17th floor, New York, NY 10016. (Paper attached: file name kosai.pdf).
Notice of Allowance, mailed on May 12, 2010 for U.S. Appl. No. 11/603,441.
Non-Final Office Action, mailed on Jan. 28, 2010 for U.S. Appl. No. 11/603,441.
Final Office Action, mailed on Nov. 3, 2009 for U.S. Appl. No. 11/603,441.
Non-Final Office Action, mailed on Dec. 30, 2008 for U.S. Appl. No. 11/603,441.
Kazama, T. et al., "Shot reduction technique for character projection lithography using combined cell stencil", Proceedings SPIE vol. 5992 (2005), pp. 59922V-1-59922V-8, SPIE, Box 10, Bellingham, WA 98227.
Hattori, K. et. al., "Electron Beam Direct Writing System EX-8D Employing Character Projection Exposure Method", Journal of Vacuum Science Technology, vol. B11(6) (1993), pp. 2346-2351, American Vacuum Society, 125 Maiden Lane, 15th Floor, New York, NY 10038.
Hara, S. et al., "Character Projection EB Data Conversion System Combined with Throughput Analyzer", Japanese Journal of Applied Physics, vol. 33 (1994), pp. 6935-6939, Japan Society of Applied Physics, Kudan-Kita building 5th floor, kudan-Kita 1-12-3, Chiyoda-ku, Tokyo 102-0073, Japan.
Nakasugi, T. et al. "Maskless Lithography Using Low Energy Election Beam: Recent Results of Proof-of-Concept Tool", Journal of Vacuum Science Technology, vol. B20(6) (2002), pp. 2651-2656, American Vacuum Society, 125 Maiden Lane, 15th Floor, New York, NY 10038.
Fujino, T. et al., "Character-Build Standard-Cell Layout Technique for High-Throughput Character-Projection EB Lithography", Proceedings SPIE vol. 5853 (2005), pp. 161-167, SPIE, Box 10, Bellingham, WA 98227.
Yamada, A. et al., "Variable cell projection as an advance in electron-beam cell projection system", Journal of Vacuum Science Technology, B 22(6) (2004), pp. 2917-2922, American Vacuum Society, 125 Maiden Lane, 15th Floor New York, NY 10038.
Kosai et al., "Throughput Enhancement in Electron Beam Direct Writing by Multiple-Cell Shot Technique for Logic Devices", 17th Annual SEMI/IEEE Advanced Semiconductor Manufacturing Conference, ASMC 2006, vol. 2006, pp. 253-256, Institute of Electrical and Electronics Engineers, 3 Park Ave. 17th Floor, New York, NY 10016.
Notice of allowance dated May 10, 2010 for U.S. Appl. No. 11/603,441.

* cited by examiner

METHOD AND SYSTEM FOR IMPROVING PARTICLE BEAM LITHOGRAPHY

RELATED APPLICATIONS

This application is related to co-pending U.S. patent application entitled, "Stencil Design and Method for Cell Projection Particle Beam Lithography", application Ser. No. 11/603,441, filed concurrently herewith, the entire disclosure of which is expressly incorporated by reference herein.

BACKGROUND

1. Field

The field of the present invention relates to particle beam lithography and, in particular, to combining and shaping cell patterns for improved particle beam efficiency.

2. Description of Related Art

In today's semiconductor manufacturing process, a common approach, as shown in FIG. 1, is the use of photo-lithography machines 10 and photo-lithography masks 12. In general, the mask 12 has an image for a layer of a chip that, through a series of lenses 14, is projected onto a wafer 16. Multiple chip images 18 are formed on the wafer 16 by stepping and repeating the mask image process across the surface of a wafer 16. The mask process is relatively fast, taking approximately one to five minutes per layer. Current dies typically comprise about 30 layers. Some precision layers require more than one mask per layer. The mask set is highly expensive, costing about 2 million dollars for a 90 nm design, and about 3 million dollars for a 65 nm design in the initial year of production. Further, it is time-consuming to produce the mask sets, requiring about a month turnaround time for creation, validation and repair. In addition, mask use is troublesome, since the use of light reaches physical limitations that have to be accounted for in some manner as the device sizes decrease, i.e., light becomes too coarse of an instrument as the design size shrinks.

One approach that overcomes some of the problems associated with the use of photo-lithography based manufacturing is the e-beam direct write method that employs an electron beam to write directly on a wafer. Cost is reduced significantly since no mask is required. Further, the use of the e-beam can handle device sizes down well below 45 nm. However, since the process is not a step and repeat procedure, it takes a long time, e.g., on the order of ten hours for the many data intensive layers. In general, this amount of time is impractical for providing efficient production of mass chip quantities. Thus, a need exists for a manner of making e-beam efficient enough to be used in mass production.

SUMMARY

In one embodiment, the invention discloses a method for particle beam lithography including forming a plurality of cell patterns on a stencil mask and shaping at least one or more of the cell patterns with a polygonal-shaped contour. The method includes exposing a first polygonal-shaped cell pattern to a particle beam so as to project the first polygonal-shaped cell pattern on a substrate, and exposing a second polygonal-shaped cell pattern, having a contour that mates with the contour of the first polygonal-shaped cell pattern, to the particle beam so as to project the second polygonal-shaped cell pattern adjacent to the first polygonal-shaped cell pattern to thereby form a combined cell with the contour of the first polygonal-shaped cell pattern mated to the contour of the second polygonal-shaped cell pattern.

In one aspect, the polygonal-shaped contour may comprise a polygonal-shaped contour having any angle between line segments. Alternately, the polygonal-shaped contour may comprise a rectilinear-shaped contour, or the polygonal-shaped contour may comprise an oblique-pattern-shaped contour.

In another aspect, particle beam lithography may comprise electron beam (EB) lithography, and the particle beam may comprise an electron beam. Alternately, particle beam lithography may comprise optical (light) laser lithography, and the particle beam may comprise an optical (light) laser beam, or particle beam lithography may comprise X-ray beam lithography, and the particle beam may comprise an X-ray beam.

In still another aspect, the first polygonal-shaped cell pattern comprises a polygonal-shaped logic cell pattern, and the second polygonal-shaped cell pattern comprises a polygonal-shaped driver cell pattern. The polygonal-shaped driver cell pattern has selective drivability. The selective drivability comprises one or more of a first, second and third stage, wherein the second stage has at least two times the power of the first stage, and the third stage has three times the power of the first stage. The drivability is selected by partially exposing the driver cell pattern to the electron beam so as to project the first stage alone, a combination of the first and second stages, or a combination of the first, second and third stages on the substrate.

In still another aspect, each cell pattern comprises an aperture formed in the stencil mask. Each cell pattern comprises a stencil pattern indicative of an electronic circuit block including a flip-flop, inverter, logic gate and memory cell. The electronic circuit block may be selected from a cell library comprising cell patterns with polygonal contours.

In one embodiment, the invention discloses a method for particle beam lithography including forming a plurality of logic cell patterns on a first stencil mask with at least one of the logic cell patterns having a polygonal shape and forming a plurality of driver cell patterns on a second stencil mask with at least one of the driver cell patterns having a polygonal shape. The method includes selecting at least one of the logic cell patterns having a polygonal shape to form a combined cell with a driver cell pattern having a polygonal shape that mates with the polygonal shape of the selected logic cell pattern and exposing the combined cell to a particle beam so as to project the selected logic cell pattern and driver cell pattern on a substrate.

In one aspect, the selected logic cell pattern and selected driver cell pattern are separately exposed to the particle beam so as to project the combined cell in two separate parts on the substrate.

These and other objects and advantages of the present teachings will become more fully apparent from the following description taken in conjunction with the accompanying drawings.

DETAILED DESCRIPTION

Figure 1:
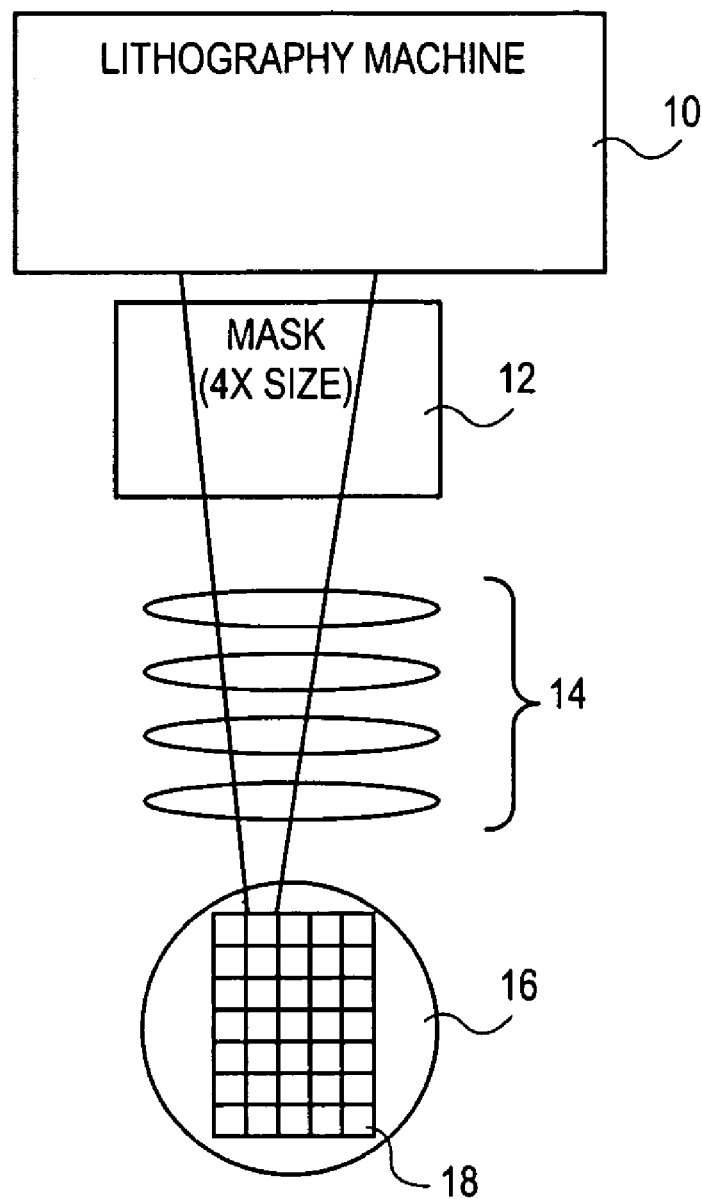
FIG. 1 shows a conventional lithography machine and mask process for projecting an image on a substrate.

Various embodiments of the invention are described herein with reference to the drawings. It should be noted that the drawings are not drawn to scale and that elements of similar structures or functions are represented by like reference numerals throughout the drawings.

The following discussion describes EB direct writing (EBDW) as an application of particle beam lithography and should not be limited to only EB direct writing (EBDW), but the this invention can be applied to mask writing using an electron beam (EB) writer with cell projection (CP) capability.

Accordingly, it should be appreciated that this invention may also be applied to other particle beam drawing technologies with transcribed patterns using at least two apertures (stencil masks) and using other types of particle beams other than an electron beam (EB), such as an optical (light) laser beam, an X-ray beam or any other particle beams that run straight and stimulate a sensitive material (resist) layer to form patterns on a substrate.

Several aspects are presented that relate to ways of increasing efficiency of particle beam use including e-beam use. Included aspects are various ways of considering cells, such as representation of a whole cell as a stamp, pre-designing cell libraries to ensure cells selected are those that can be produced via e-beam, shaping cells as polygonal or with a polygonal contour, and structuring ASICs at the cell level. In one embodiment, the polygonal-shaped contour may comprise a polygonal-shaped contour having any angle between line segments that form the shape. Alternately, the polygonal-shaped contour may comprise a rectilinear-shaped contour, or the polygonal-shaped contour may comprise an oblique-pattern-shaped contour.

Figure 2A:
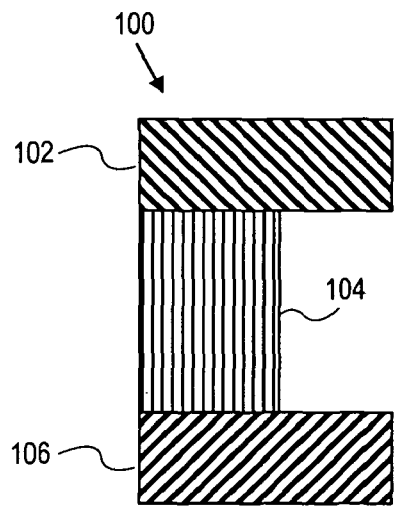
FIG. 2A shows a single cell formed by a plurality of cell patterns.
Figure 2B:
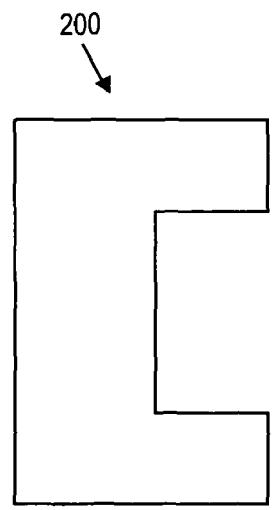
FIG. 2B shows the single cell of FIG. 2A as a stamp.

With respect to stamps, current capability related to e-beam cell projection supports small patterns or stamps. Often, cells are formed by breaking patterns into smaller pieces that together form a cell. Referring to FIG. 2A, a single cell 100 is formed by three patterns 102, 104, 106. As the size of transistors decreases, the number of transistors capable of fitting within a stamp increases, thus allowing for production of more meaningful cells in a pattern. In order to make e-beam more efficient and less prone to the errors that 'stitching' a pattern together can lead to, the shrinking size of transistors is taken advantage of by placing entire cells in a stamp 200, as shown in FIG. 2B. For example, stamps of NAND gates, memory cells, etc., are viable. By producing a meaningful cell in a stamp, the time spent per layer is reduced to about 30 minutes. In addition to a reduction in the per layer time required, whole cell stamps are more accurate, having better consistency with less process variations, as no transistors are broken up to produce the cell.

With respect to cell libraries, another aspect of the cells to further increase production via the use of e-beams is a shift in the design of a cell library and design methodology. Each design may be examined to determine what cells occur most often, and stencils are made for those cells, wherein each cell or cell pattern comprises an aperture formed in the stencil mask.

In a shift to this approach, the invention increases the percentage of patterns that can be stencil-masked by pre-designing cells that can be stenciled. Then during the design process, selection of cells in a design according to those with stencils already available. Thus, a set of standard cell libraries can be pre-designed based on maximizing the use of or ensuring that those cells that are known to be capable of being stenciled. In this manner, the cells available for selection are ensured of being able to be produced by use of e-beam. The stencil mask becomes the first order of priority for cell library design and design methodology.

The tools used throughout the design flow are run to support the use of cells with stencils. For example, an register transfer level (RTL) complier is run such that it only chooses cells known to be able to be stenciled, or, in another embodiment, optimize for the eventual run-time of the e-beam machines by, for example, minimizing the shot count. Or, routing paths are picked for which there are stencils by restricting a router to certain pitches that have stencils, or, in another embodiment, post-processing the routing to conform to available stencils or their available alterations.

Figure 3A:
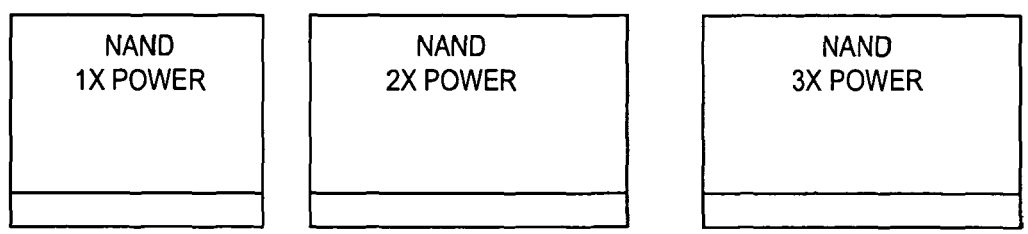
FIG. 3A shows rectangular cells with two components.

With further respect to cell libraries and shape, the way in which the cell library is provided is enhanced by altering the shape of the cells. In some cell libraries, there are about 400 rectangular elements. The elements comprise various gates, e.g., NAND, OR, inverters, flip-flops, etc., and each gate is provided as a different rectangular element for different rectangular output drivers, e.g., NAND 1x power 300, NAND 2x power 302, NAND 3x power 304, etc., as shown in FIG. 3A.

In accordance with an aspect of the invention, a design cell library can be created such that there are multiple cell libraries each with a small number of stencils that are leveraged as much as possible. One aspect of this is a change in the way that the cells are shaped by making cells polygonal or rectilinear in shape or contour, rather than strictly rectangular. It should be appreciated by those skilled in the art that the polygonal-shaped contour may comprise a polygonal-shaped contour having any angle between line segments. Alternately, the polygonal-shaped or rectilinear-shaped contour may comprise an oblique-pattern-shaped contour.

Figure 3B:
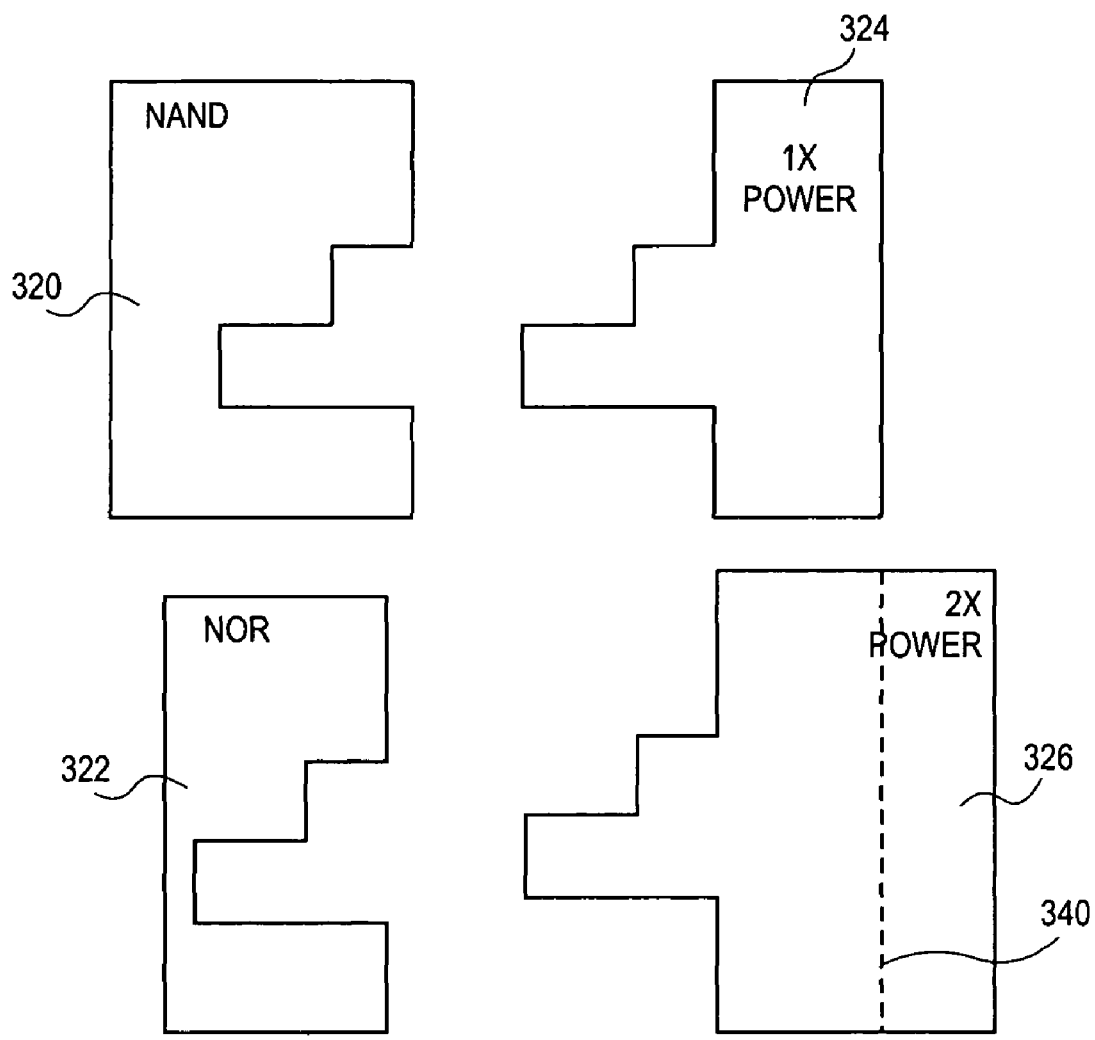
FIG. 3B shows a cell having a logic component and a selectable driver component.

Referring to FIG. 3B, a full or whole cell comprises at least two components including a logic component, such as 320, 322, and a driver component, such as 324, 326. For example, NAND cell 320 and NOR cell 322 comprise logic components of one library, and driver cells 1x (324) and 2x (326) comprise driver components of a second library. As shown in FIG. 3B, the cell patterns have polygonal-shaped contours. In one aspect, the logic component 320 may be considered a first polygonal-shaped cell pattern, and the driver component 324 may be considered a second polygonal-shaped cell pattern.

As shown in FIG. 3B, the second polygonal-shaped cell pattern 324 has a contour that mates with the contour of the first polygonal-shaped cell pattern 320 so as form a combined cell pattern that can be projected on a substrate. In one embodiment, to formed the combined cell, the first polygonal-shaped cell pattern 320 can be projected on a substrate, and the second polygonal-shaped cell pattern 324 can be projected on the same substrate adjacent to the first polygonal-shaped cell pattern 320 to thereby form a combined cell with the contour of the first polygonal-shaped cell pattern 320 mated to the contour of the second polygonal-shaped cell pattern 324. It should be appreciated that the polygonal-shaped contour may comprise a polygonal-shaped contour having any angle between line segments, the polygonal-shaped contour may comprise a rectilinear-shaped contour, or the polygonal-shaped contour may comprise an oblique pattern, shape or contour without departing from the scope of the invention.

In one aspect, the logic cell patterns and driver cell patterns may be formed on a single stencil or separate stencils without departing from the scope of the invention. In another aspect, each polygonal-shaped cell pattern may include a stencil pattern indicative of various electronic circuit blocks including flip-flops, inverters, logic gates and memory cells. Moreover, the electronic circuit block may be selected from a cell library comprising cell patterns with polygonal contours and/or shapes.

Referring to FIG. 3B, in one embodiment of the invention, the cells 320, 322, 324, 326 are provided as rectilinear shapes, and a single logic cell 320, 322 may be selected for use with any of the driver cells 324, 326 as desired. As shown in FIG. 3B, the second driver cell 326 (2x power) may be partially exposed to form the first driver cell 324 (1x power) along dashed line 340. In this way, for example, more flexibility is achieved with rectilinear shapes, and the number of cells needed on the stencil is reduced. Moreover, the use of smaller cell shapes better supports stamping by a particle beam, such as an electron beam.

Figure 4:
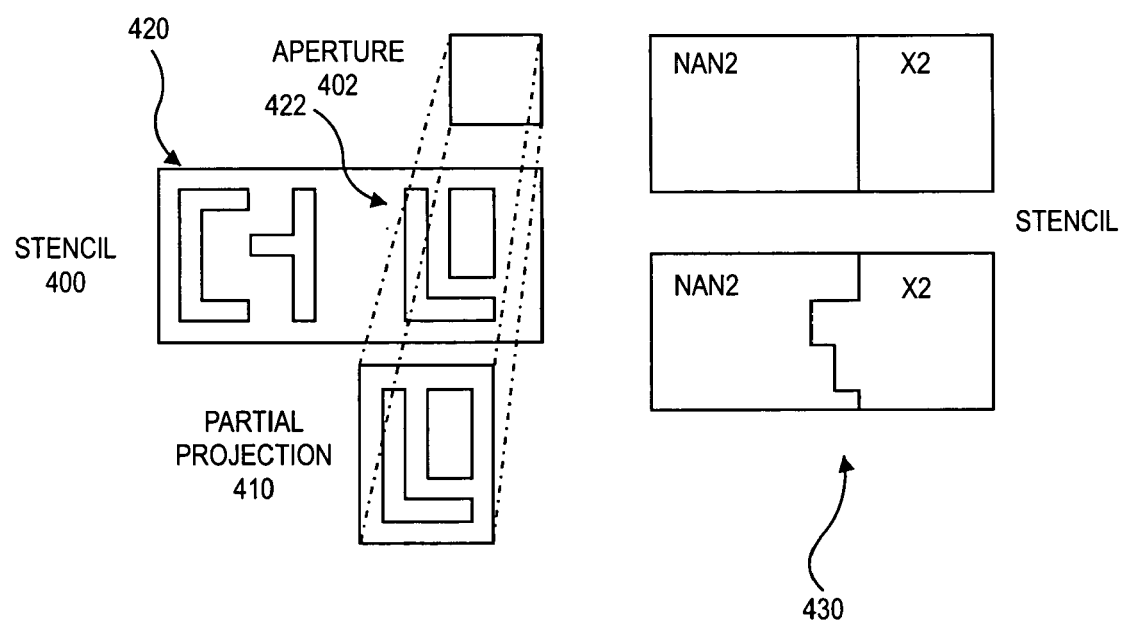
FIG. 4 shows the combination of the logic component and the driver component to form a cell via partial projection.

Referring to FIG. 4, a method to optimize the number of patterns that are available on a given stencil set 400 by optimizing the use of blanking apertures 402 is included. By studying cell primitives 420, 422 that often appear adjacent to each other, the stencil 400 is designed to be used in whole or in part to combine 430 with other cell primitives. In FIG. 3B, the cell patterns 320, 324 are shown separated, and in FIG. 4, the cell patterns 320, 324 are shown combined 430. An objective of the invention is to minimize or reduce the number of shots required by maximizing or increasing the number of cell primitives and primitive combinations that are available on a stencil mask set.

Figure 5:
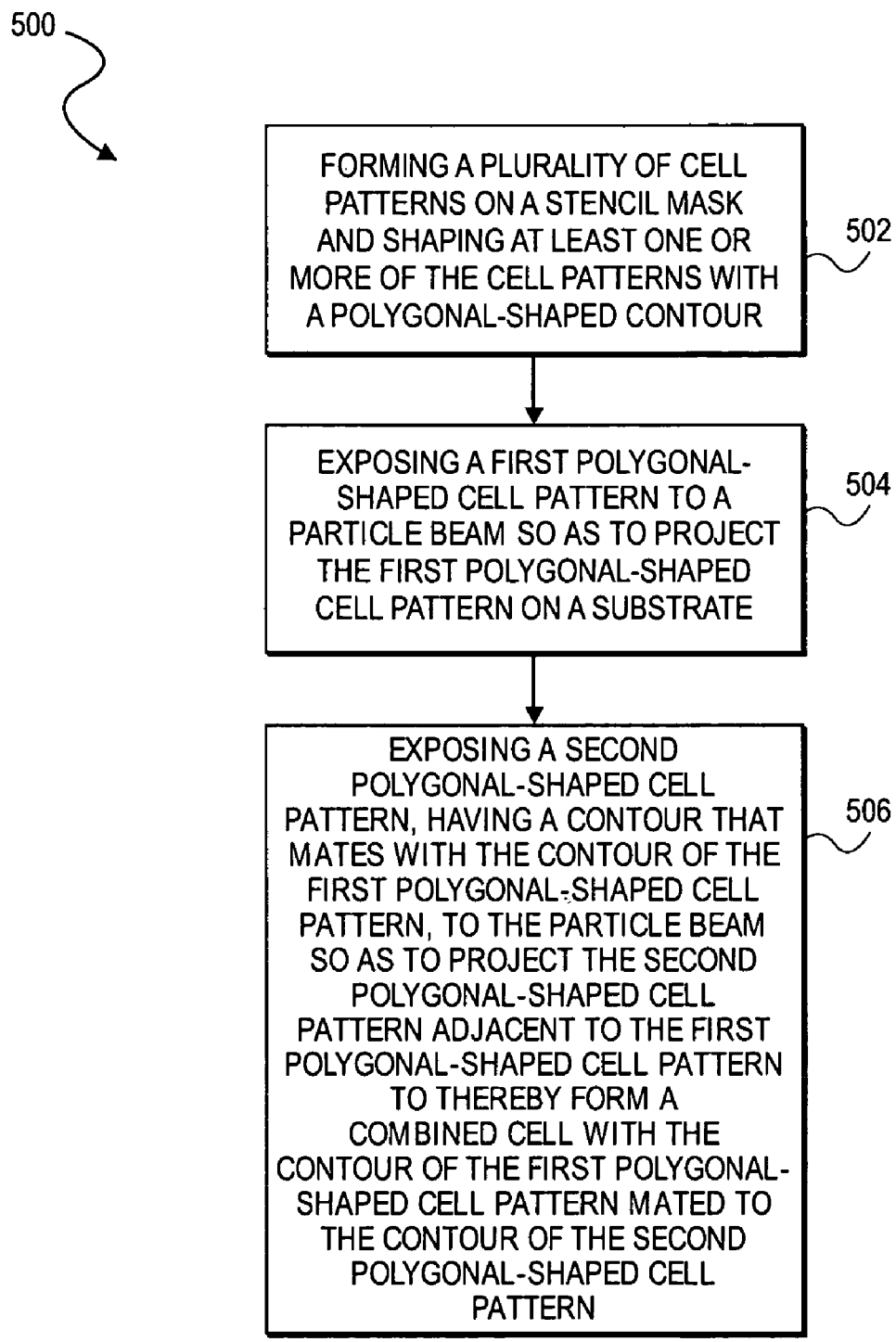
FIGS. 5-6 show methods of e-beam lithography.

Referring to FIG. 5, one embodiment of a process flow method 500 for particle beam lithography includes, at step 502, forming a plurality of cell patterns on a stencil mask and shaping at least one or more of the cell patterns with a polygonal-shaped contour. At step 504, the method 500 includes exposing a first polygonal-shaped cell pattern to a particle beam so as to project the first polygonal-shaped cell pattern on a substrate. At step 506, the method 500 includes exposing a second polygonal-shaped cell pattern, having a contour that mates with the contour of the first polygonal-shaped cell pattern, to the particle beam so as to project the second polygonal-shaped cell pattern adjacent to the first polygonal-shaped cell pattern to thereby form a combined cell with the contour of the first polygonal-shaped cell pattern mated to the contour of the second polygonal-shaped cell pattern.

In one aspect, the polygonal-shaped contour may comprise a polygonal-shaped contour having any angle between line segments. In another aspect, the polygonal-shaped contour may comprise a rectilinear-shaped contour, or the polygonal-shaped contour may comprise an oblique pattern, shape or contour.

In still another aspect, particle beam lithography may comprise electron beam (EB) lithography, wherein the particle beam comprises an electron beam. In still another aspect, particle beam lithography may comprise optical (light) laser lithography, wherein the particle beam comprises an optical (light) laser beam. In still another aspect, particle beam lithography may comprise X-ray beam lithography, wherein the particle beam comprises an X-ray beam.

Figure 6:
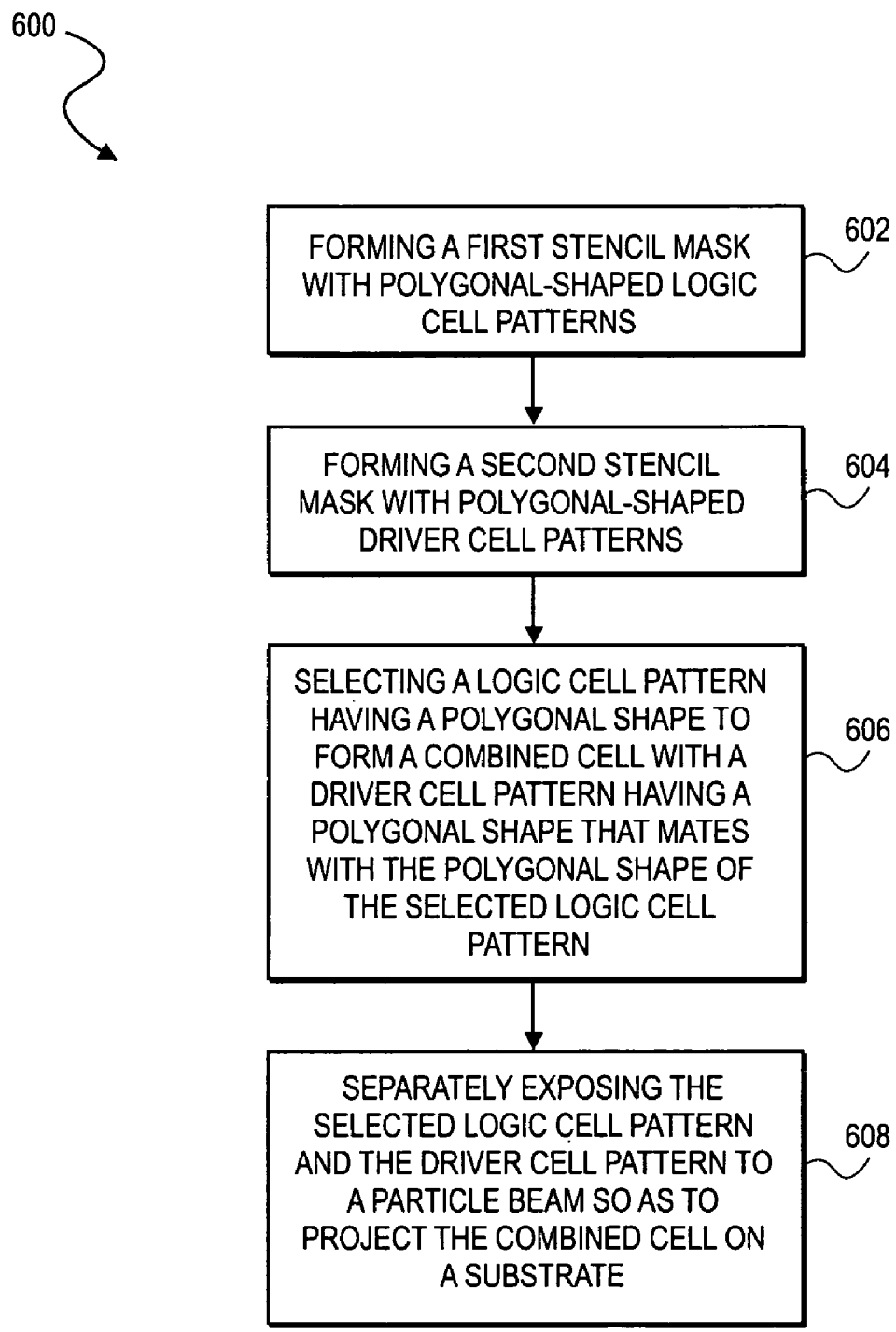

Referring to FIG. 6, a process flow method 600 for particle beam lithography includes, at step 602, forming a plurality of logic cell patterns on a first stencil mask with at least one of the logic cell patterns having a polygonal shape. At step 604, the method 600 includes forming a plurality of driver cell patterns on a second stencil mask with at least one of the driver cell patterns having a polygonal shape. At step 606, the method 600 includes selecting at least one of the logic cell patterns having a polygonal shape to form a combined cell with a driver cell pattern having a polygonal shape that mates with the polygonal shape of the selected logic cell pattern. At step 608, the method 600 includes exposing the combined cell to a particle beam so as to project the selected logic cell pattern and driver cell pattern on a substrate. In one aspect of the method 600, at step 608, the selected logic cell pattern and selected driver cell pattern are separately exposed to the particle beam so as to project the combined cell in two separate parts on the substrate, wherein this separate exposure and projection can be performed in any order.

In another aspect, the polygonal or rectilinear-shaped driver cell pattern has selective drivability. The selective drivability may include at least a first and second stage, wherein the second stage has at least twice the power of the first stage. The selective drivability may also include a first, second and third stage, wherein the second stage has at least two times the power of the first stage and the third stage has three times the power of the first stage. The driver cell pattern may include additional stages, such as four, five and six times the power of the first stage. The drivability may be selected by partially exposing the driver cell pattern to the electron beam so as to project the first stage or a combination of the first stage and additional stages on the substrate.

In still another aspect, the polygonal-shaped contour may comprise a polygonal-shaped contour having any angle between line segments. In still another aspect, the polygonal-shaped contour or rectilinear-shaped contour may comprise an oblique pattern, shape or contour.

In yet another aspect, particle beam lithography may comprise electron beam (EB) lithography, optical (light) laser lithography or X-ray beam lithography, wherein the particle beam comprises an electron beam, an optical (light) laser beam or an X-ray beam, respectively.

Approaching wafer creation from an e-beam perspective in this manner has further implication with respect to mask-making. Typically, e-beam techniques are used by mask-making companies to make a mask. By approaching wafer production from the perspective of e-beam use as well, there is less discrepancy between wafer production and the mask formation.

With increased efficiency in the use of e-beam, new business and manufacturing avenues can be approached. With the reduction in production time to a reasonable period by the use of e-beam as described herein, it becomes feasible to consider integrating a design center with a mini-FAB to offer a prototype center for customers. In this manner, customers would have more local access to a small level production of wafers, which would aid in cutting down turnaround time for testing and fixes. Such local support offers further opportunity to allow Internet-based testing mechanisms and remote access by customers to monitor the status of the prototype as testing occurs. The internet-based testing mechanisms also include build-in test circuit suitable for e-beam direct writing.

Additionally, mass production could be arranged through a predefined agreement akin to a second source agreement, having a mass production source licensed with compatible equipment and methodology. Such an arrangement builds a seamless bridge from small scale to large scale production.

The prior art does not provide approaches to e-beam use that achieve sufficient efficiency to make e-beam use viable for mass production. The described approaches of the invention provide for greater efficiency and direct changes to current methods in order to better account for the needs related to e-beam use. The approaches are seen to be vital to ensuring better ability to utilize e-beam as transistor size is reduced in order to provide a viable alternative to current lithography approaches.

Even though the above discussion is directed to e-beam (EB) direct writing, application of this invention should not limited to EB direct writing but can be applied to mask writing using an EB writer with CP capability. Hence, it should be appreciated by those skilled in the art that this invention may also be applied to other particle beam drawing technologies with transcribed patterns, such as optical (light) laser beam technology, X-ray beam technology, or any other particle beam technology that forms patterns on a substrate.

Various aspects of the invention provide for formation of full or whole cells in a stamp with partial projection techniques to form the full or whole cells from combining parts of cells of the same or different stencil mask sets. The invention provides for stencil mask prioritization of library design with polygonal-shaped or rectilinear-shaped library cell elements and/or patterns, wherein library primitives are combined to produce full or whole cells with the optimized use of partial exposure of cell patterns from stencils.

Although particular embodiments of the invention have been shown and described, it will be understood that it is not intended to limit the invention to the preferred embodiments, and it will be obvious to those skilled in the art that various changes and modifications may be made without departing from the scope of the invention. The specification and drawings are, accordingly, to be regarded in an illustrative rather than restrictive sense. The invention is intended to cover alternatives, modifications, and equivalents, which may be included within the scope of the invention as defined by the claims.

What is claimed is:

1. A method for particle beam lithography, comprising:
   forming a plurality of cell patterns on a stencil mask for manufacturing of a semiconductor device and shaping at least one of the plurality of cell patterns with a first polygonal-shaped contour, wherein
   the act of shaping the at least one of the plurality of cell patterns comprises determining a plurality of cell primitives which are known to be characterized by being capable of being stencil-masked to increase reuse of the plurality of cell primitives for manufacturing of the semiconductor device;
   exposing a first polygonal-shaped cell pattern on the stencil mask to a particle beam so as to project the first polygonal-shaped cell pattern on a substrate; and
   exposing at least a part of a second polygonal-shaped cell pattern on the stencil mask, having a second contour, to the particle beam, wherein the second contour is used to produce a second image that mates with a first image produced by using the first polygonal-shaped contour of the first polygonal-shaped cell pattern.

2. The method of claim 1, wherein the first polygonal-shaped contour comprises a polygonal-shaped contour having any angle between line segments.

3. The method of claim 1, wherein the first polygonal-shaped contour comprises a rectilinear-shaped or an oblique-pattern-shaped contour.

4. The method of claim 1, wherein the act of identifying the plurality of cell primitives comprises increasing a number of cell primitives or a number of primitive combinations that are available on the stencil mask.

5. The method of claim 1, further comprising selecting a plurality of cells in a design of the semiconductor device according to one or more cells with one or more stencils that are already available.

6. The method of claim 1, wherein particle beam lithography comprises electron beam (EB) lithography, X-ray beam lithography, or optical (light) laser lithography, and wherein the particle beam comprises an optical (light) laser beam, an electron beam, or an X-ray beam.

7. The method of claim 1, further comprising improving a number of patterns available on a stencil set by improving a use of one or more blanking apertures.

8. The method of claim 1, wherein the first polygonal-shaped cell pattern or the second polygonal-shaped cell pattern comprises a polygonal-shaped logic cell pattern.

9. The method of claim 1, wherein at least two of the plurality of cell primitives are determined to be adjacent to each other in a number of places on the stencil mask.

10. The method of claim 9, wherein the polygonal-shaped driver cell pattern has selective drivability.

11. The method of claim 10, wherein the selective drivability comprises a first, second and third stage, and wherein the second stage has at least two times the power of the first stage, and wherein the third stage has at least three times the power of the first stage.

12. The method of claim 11, wherein drivability is selected by partially exposing the driver cell pattern to the electron beam so as to project the first stage alone, a combination of the first and second stages, or a combination of the first, second and third stages on the substrate.

13. The method of claim 1, wherein each cell pattern comprises an aperture formed in the stencil mask.

14. The method of claim 1, wherein each cell pattern comprises a stencil pattern indicative of an electronic circuit block including a flip-flop, an inverter, a logic gate, or a memory cell.

15. The method of claim 14, wherein the electronic circuit block is selected from a cell library comprising cell patterns with polygonal contours.

16. A method for particle beam lithography, comprising:
   forming a plurality of logic cell patterns on a first stencil mask for a semiconductor device with at least one of the plurality of logic cell patterns having a first polygonal shape;
   forming a plurality of driver cell patterns on a second stencil mask with at least one of the driver cell patterns having a second polygonal shape;
   selecting at least one of the logic cell patterns having a polygonal shape to form a combined cell with the at least one of the driver cell patterns having the second polygonal shape that mates with the first polygonal shape of the at least one of the logic cell patterns; and
   exposing the combined cell to a particle beam so as to project the at least one of the logic cell pattern and the at least one of the driver cell patterns on a substrate.

17. The method of claim 16, wherein the at least one of the plurality of logic cell patterns and the at least one of the plurality of driver cell patterns are separately exposed to the particle beam so as to project the combined cell in two separate parts on the substrate.

18. The method of claim 16, wherein the polygonal-shaped driver cell pattern has selective drivability.

19. The method of claim 18, wherein the selective drivability comprises at least a first and second stage, wherein the second stage has at least twice the power of the first stage.

20. The method of claim 19, wherein drivability is selected by partially exposing the at least one of the plurality of driver cell patterns to the particle beam so as to project the first stage alone or a combination of the first and second stages on the substrate.

21. The method of claim 16, wherein each cell pattern comprises an aperture formed in the first stencil mask or the second stencil mask.

22. The method of claim 16, wherein each cell pattern comprises a stencil pattern indicative of an electronic circuit block including a flip-flop, an inverter, a logic gate, or a memory cell.

23. The method of claim 22, wherein the electronic circuit block is selected from a cell library comprising one or more cell patterns with one or more polygonal-shaped contours.

24. The method of claim 16, wherein the first polygonal shape or the second polygonal shape comprises a polygonal shape having any angle between line segments.

25. The method of claim 16, wherein the first polygonal shape or the second polygonal shape comprises a rectilinear shape or an oblique pattern shape.

26. The method of claim 16, wherein act of identifying the plurality of cell primitives comprises increasing a number of cell primitives or a number of primitive combinations that are available on the stencil mask.

27. The method of claim 16, wherein particle beam lithography comprises electron beam (EB) lithography, optical (light) laser lithography, or X-ray beam lithography, and wherein the particle beam comprises an electron beam, an optical (light) laser beam, or an X-ray beam.

28. The method of claim 16, further comprising selecting a plurality of cells in a design of the semiconductor device according to one or more cells with one or more stencils that are already available.

29. The method of claim 16, further comprising improving a number of patterns available on a stencil set by improving a use of one or more blanking apertures.

30. A method for particle beam lithography, comprising:
forming a plurality of cell patterns on a stencil mask for manufacturing of a semiconductor device, wherein
the act of forming the plurality of cell patterns comprises identifying a plurality of cell primitives which are used to shape the at least one of the plurality of cell patterns in at least two locations on the stencil mask;
selecting a logic cell pattern having a first polygonal contour to form a first part of a combined cell pattern;
selecting a driver cell pattern having a second polygonal contour that mates with the first polygonal contour of the logic cell pattern; and
exposing the combined cell pattern to a particle beam so as to project the selected logic cell pattern and the selected driver cell pattern on a substrate.

31. The method of claim 30, wherein the logic cell pattern and the driver cell pattern are separately exposed to the particle beam so as to project the combined cell pattern in two separate parts on the substrate.

32. The method of claim 30, wherein the polygonal contour comprises a polygonal contour having any angle between line segments.

33. The method of claim 30, wherein the polygonal contour comprises a rectilinear contour or an oblique pattern contour.

34. The method of claim 30, wherein act of identifying the plurality of cell primitives comprises increasing a number of cell primitives or a number of primitive combinations that are available on the stencil mask.

35. The method of claim 30, wherein particle beam lithography comprises electron beam (EB) lithography, optical (light) laser lithography, or X-ray lithography, and wherein the particle beam comprises an electron beam, optical (light) laser beam, or an X-ray beam.

36. The method of claim 30, further comprising selecting a plurality of cells in a design of the semiconductor device according to one or more cells with one or more stencils that are already available.

37. The method of claim 30, further comprising improving a number of patterns available on a stencil set by improving a use of one or more blanking apertures.

38. A method for particle beam lithography, comprising:
forming a plurality of cell patterns on a stencil mask for a semiconductor device with polygonal shapes;
forming a combined cell with at least a portion of a polygonal-shaped logic cell pattern and at least a portion of a driver cell pattern having a second polygonal shape that mates with a first polygonal shape of the at least a portion of the logic cell pattern; and
separately exposing the at least a portion of the logic cell pattern and the at least a portion of the driver cell pattern to a particle beam so as to project the combined cell pattern on a substrate.

39. The method of claim 38, wherein the polygonal shape comprises a polygonal shape having any angle between line segments.

40. The method of claim 38, wherein the polygonal shape comprises a rectilinear shape or an oblique pattern shape.

41. The method of claim 38, wherein the act of identifying the plurality of cell primitives comprises increasing a number of cell primitives or a number of primitive combinations that are available on the stencil mask.

42. The method of claim 38, wherein particle beam lithography comprises electron beam (EB) lithography, optical (light) laser lithography, or X-ray beam lithography, and wherein the particle beam comprises an electron beam, optical (light) laser beam, or an X-ray beam.

43. The method of claim 38, further comprising selecting a plurality of cells in a design of the semiconductor device according to one or more cells with one or more stencils that are already available.

44. The method of claim 38, further comprising improving a number of patterns available on a stencil set by improving a use of one or more blanking apertures.

* * * * *